United States Patent
Pesaturo et al.

(10) Patent No.: US 12,025,506 B2
(45) Date of Patent: Jul. 2, 2024

(54) AMBIENT TEMPERATURE SENSOR WHICH MAY BE COUPLED TO A PRINTED CIRCUIT BOARD WITH AN IMPROVED PACKAGE

(71) Applicant: STMicroelectronics S.r.l., Agrate Brianza (IT)

(72) Inventors: Massimiliano Pesaturo, Torre de' Roveri (IT); Marco Omar Ghidoni, Melzo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 631 days.

(21) Appl. No.: 17/219,433

(22) Filed: Mar. 31, 2021

(65) Prior Publication Data

US 2021/0310877 A1 Oct. 7, 2021

(30) Foreign Application Priority Data

Apr. 2, 2020 (IT) .................. 102020000007009

(51) Int. Cl.
  *G01K 7/01* (2006.01)
  *H05K 1/18* (2006.01)

(52) U.S. Cl.
  CPC ............. *G01K 7/015* (2013.01); *H05K 1/181* (2013.01); *H05K 2201/10151* (2013.01);
  (Continued)

(58) Field of Classification Search
  CPC ............... G01K 7/015; H05K 1/181; H05K 2201/10151; H05K 2201/10378; H05K 2201/10515; H05K 2201/1053
  See application file for complete search history.

(56) References Cited

U.S. PATENT DOCUMENTS 5,750,926 A * 5/1998 Schulman ............. H01L 23/057
                                                  257/710
7,439,616 B2 10/2008 Minervini
(Continued)

FOREIGN PATENT DOCUMENTS

WO  2013/062533 A1  5/2013
WO  2014/105904 A1  7/2014

OTHER PUBLICATIONS

Shennan Circuits Co., Ltd., "SCC MEMS Substrate Products Introduction," Jul. 2014, 25 pages.
(Continued)

*Primary Examiner* — Randy W Gibson
(74) *Attorney, Agent, or Firm* — Seed IP Law Group LLP

(57) ABSTRACT

An ambient temperature sensor is provided that may be coupled to a PCB. The ambient temperature sensor includes a package including a first cap and an insulating structure. The insulating structure is formed of thermally insulating material, and the first cap and the insulating structure delimit a first cavity. A semiconductor device is included and generates an electrical signal indicative of a temperature. The semiconductor device is fixed on top of the insulating structure and arranged within the first cavity. The package may be coupled to the PCB so that the insulating structure is interposed between the semiconductor device and the PCB. The insulating structure delimits a second cavity, which extends below the semiconductor device and is open laterally.

20 Claims, 4 Drawing Sheets

(52) U.S. Cl.
 CPC .............. *H05K 2201/10378* (2013.01); *H05K 2201/10515* (2013.01); *H05K 2201/1053* (2013.01)

(56) References Cited

U.S. PATENT DOCUMENTS

| | | | |
|---|---|---|---|
| 8,351,634 B2 | 1/2013 | Khenkin | |
| 10,812,017 B1* | 10/2020 | Tseng | H01L 23/145 |
| 11,229,130 B2* | 1/2022 | Wu | H01L 23/367 |
| 2009/0051447 A1* | 2/2009 | McCracken | H05K 1/0212 |
| | | | 331/70 |
| 2012/0229225 A1* | 9/2012 | Horie | H02N 2/001 |
| | | | 331/158 |
| 2016/0380612 A1 | 12/2016 | Morita et al. | |
| 2019/0379325 A1 | 12/2019 | Kondo et al. | |
| 2020/0076438 A1* | 3/2020 | Hsieh | H05K 1/0212 |
| 2021/0045257 A1* | 2/2021 | Wu | H01L 23/34 |
| 2021/0257988 A1* | 8/2021 | Tseng | H03H 9/0547 |

OTHER PUBLICATIONS

Kasemsadeh et al., "Optimizing Placement and Routing for Humidity Sensors," Texas Instruments, Application Report, SNAA297A, Sep. 2016, Revised Sep. 2017, 25 pages.

* cited by examiner

AMBIENT TEMPERATURE SENSOR WHICH MAY BE COUPLED TO A PRINTED CIRCUIT BOARD WITH AN IMPROVED PACKAGE

BACKGROUND

Technical Field

The present disclosure relates to an ambient temperature sensor which may be coupled to a Printed-Circuit Board (PCB) and which includes an improved package.

Description of the Related Art

As is known, today it is common to use temperature sensors on board PCBs in order to detect possible sudden local increases in temperature. For instance, the temperature sensors are integrated in PCBs in order to detect the temperature in proximity of heat sources integrated in the PCBs. In this case, the temperature sensor, formed by a corresponding integrated semiconductor circuit, is thermally coupled to the heat source.

This having been said, the need is currently felt to be able to use the temperature sensors that equip PCBs for measuring the external temperature, i.e., the ambient temperature. In other words, the need is felt to have available temperature sensors that can be integrated in PCBs and that enable precise measurement of the ambient temperature. However, typically the temperature sensors that are to equip PCBs have packages that are not designed for optimizing the thermal coupling with the outside world. Moreover, the measurements supplied by the temperature sensors may be affected by the presence of heat sources on the PCBs themselves.

BRIEF SUMMARY

In various embodiments, the present disclosure provides an ambient temperature sensor that will overcome at least in part the drawbacks of the prior art.

In at least one embodiment, an ambient temperature sensor is provided that is couplable to a printed circuit board (PCB). The ambient temperature sensor includes a package and a semiconductor device. The package includes a first cap and an insulating structure. The insulating structure is formed of thermally insulating material, and the first cap and the insulating structure delimit a first cavity. The semiconductor device is configured to generate an electrical signal indicative of a temperature, and the semiconductor device is fixed on the insulating structure and arranged within the first cavity. The package is configured to couple to the PCB with the insulating structure interposed between the semiconductor device and the PCB, and the insulating structure delimits a second cavity, which extends below the semiconductor device and is open laterally.

In at least one embodiment, a system is provided that includes a printed circuit board (PCB) and a temperature sensor coupled to the PCB. The temperature sensor includes a package and a semiconductor device. The package includes a first cap and an insulating structure. The insulating structure is formed of thermally insulating material, and the first cap and the insulating structure delimit a first cavity. The semiconductor device is configured to generate an electrical signal indicative of a temperature, and the semiconductor device is fixed on the insulating structure and arranged within the first cavity. The package is coupled to the PCB with the insulating structure interposed between the semiconductor device and the PCB, and the insulating structure delimits a second cavity, which extends below the semiconductor device and is open laterally.

In at least one embodiment, a method is provided that includes coupling a temperature sensor to a printed circuit board (PCB). The temperature sensor includes a package and a semiconductor device. The package includes a first cap and an insulating structure. The insulating structure is formed of thermally insulating material, and the first cap and the insulating structure delimit a first cavity. The semiconductor device is configured to generate an electrical signal indicative of a temperature, and the semiconductor device is fixed on the insulating structure and arranged within the first cavity. The package is coupled to the PCB with the insulating structure interposed between the semiconductor device and the PCB, and the insulating structure delimits a second cavity, which extends below the semiconductor device and is open laterally.

BRIEF DESCRIPTION OF THE SEVERAL VIEWS OF THE DRAWINGS

For a better understanding of the present disclosure, preferred embodiments thereof will now be described purely by way of non-limiting example, with reference to the attached drawings, wherein.

DETAILED DESCRIPTION

Figure 1:
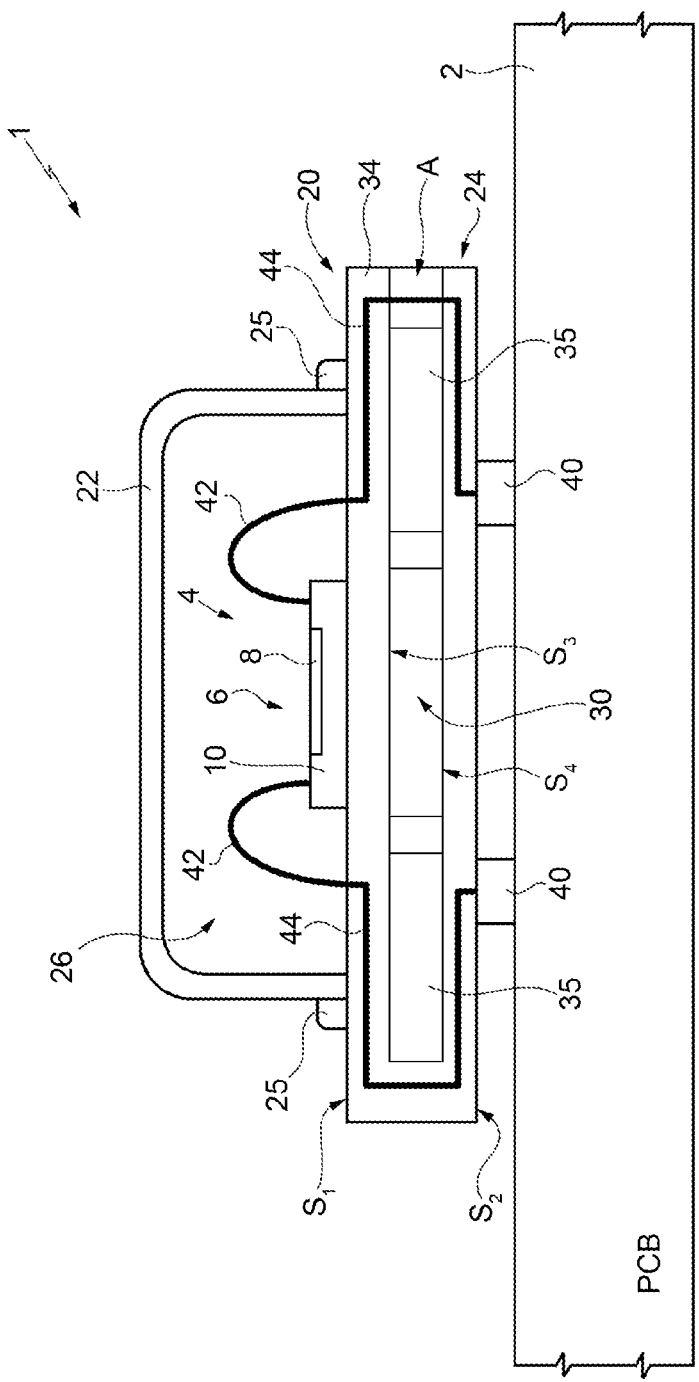
FIG. 1 is a schematic cross-sectional view of a temperature sensor coupled to a PCB.
Figure 2:
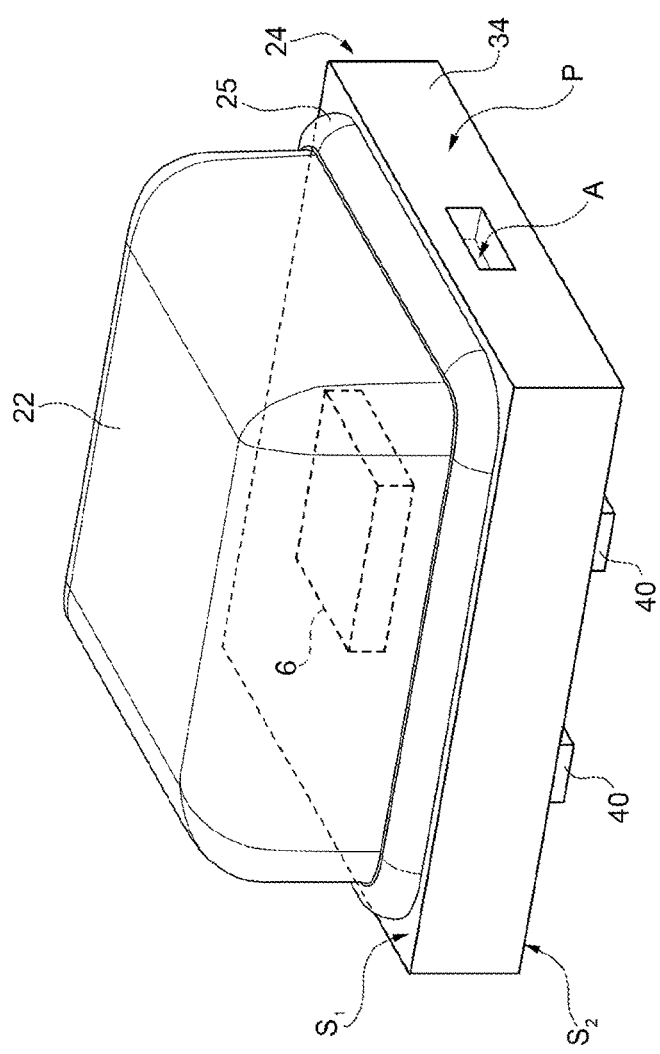
FIG. 2 is a schematic perspective view of the sensor illustrated in FIG. 1.
Figure 3:
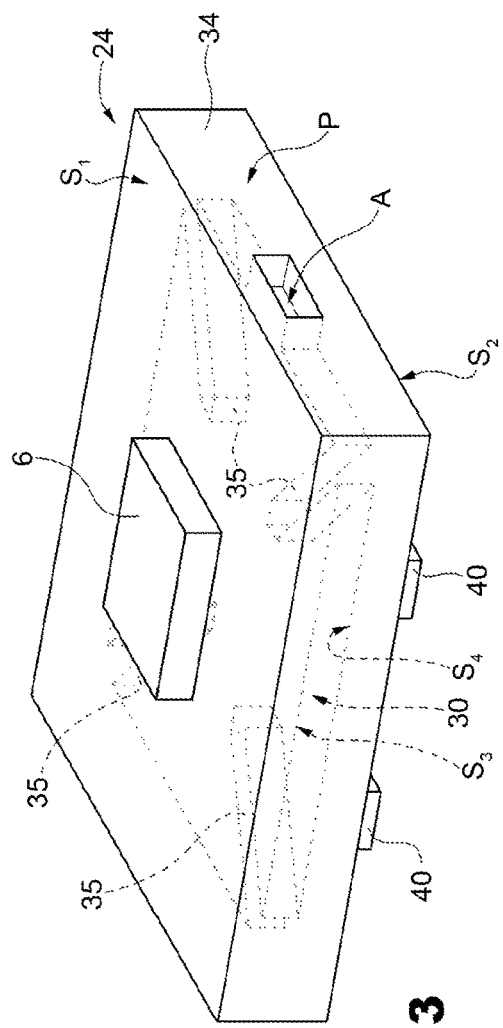
FIG. 3 is a schematic perspective view with portions removed of the sensor illustrated in FIGS. 1 and 2.

FIGS. 1 and 2 represent a temperature sensor 1, which is integrated in a PCB 2.

In detail, the temperature sensor 1 comprises a sensing device 4, which in turn comprises a die 6 of semiconductor material, inside which a sensitive region 8 and a processing circuit 10 are formed, the latter being, for example, formed by a corresponding Application-Specific Integrated Circuit (ASIC) and being electrically coupled to the sensitive region 8. The sensitive region 8 is configured so as to vary, for example, an electrical parameter thereof as a function of the temperature to which it is subjected so as to generate a corresponding electrical signal, which is processed by the processing circuit 10 so as to generate an output signal, which is indicative of the temperature detected by the sensing device 4.

The temperature sensor 1 further comprises a package 20, which in turn comprises a first cap 22, formed, for example, of metal material (e.g., stainless steel) or insulating material (e.g., a plastic or an epoxy resin), and of a first insulating structure 24, which is formed by a thermally and electrically insulating material, such as, for example, a material chosen from among: ceramic, alumina or a Bismaleimide-Triazine (BT) resin.

The first insulating structure 24 comprises a main body 34, which has the shape of a parallelepiped and is delimited at the top and at the bottom by a top surface $S_1$ and a bottom surface $S_2$, respectively.

The first cap 22 overlies the first insulating structure 24 and is mechanically coupled to the top surface $S_1$ so as to delimit, together with the first insulating structure 24, a cavity 26, referred to in what follows as the die cavity 26. The die 6 is housed within the closed cavity 26 and is fixed to the top surface $S_1$ of the first insulating structure 24, for example via a glue or a so-called dry film of a die-attach film (DAF) type or a solder paste (which are not illustrated).

In greater detail, the temperature sensor 1 comprises a fixing region 25, which guarantees the mechanical coupling between the first cap 22 and the first insulating structure 24. For instance, the fixing region 25 is formed by a glue or solder paste. Furthermore, the fixing region 25 has an annular shape and is arranged over the top surface $S_1$, so as to surround entirely, in direct contact, a bottom portion of the first cap 22, this bottom portion of the first cap 22 contacting the top surface $S_1$. Without this implying any loss of generality, the first cap 22 is without holes in such a way that the die cavity 26 is closed.

A cavity 30 extends within the main body 34 of the first insulating structure 24, referred to in what follows as the decoupling cavity 30. The decoupling cavity 30 substantially has the shape of a parallelepiped, inside which four arms 35 extend; more precisely, the decoupling cavity 30 has an envelope (i.e., an encumbrance) shaped like a parallelepiped, which is delimited at the top and at the bottom by a top inner surface $S_3$ and by a bottom inner surface $S_4$, respectively, which are plane and are interposed, at a distance, between the top surface $S_1$ and the bottom surface $S_2$. The top surface $S_1$, the bottom surface $S_2$, the top inner surface $S_3$ and the bottom inner surface $S_4$ are parallel to one another.

The four arms 35 form a single piece with the main body 34 and, as has been said previously, extend inside the decoupling cavity 30. Without this implying any loss of generality, the arms 35 have the same shape and each extend starting from a corresponding peripheral edge of the latter, i.e., from a corresponding peripheral portion of the latter, towards the centre of the decoupling cavity 30. In other words, the arms 35 form the shape of the decoupling cavity 30.

In addition, in top view (FIG. 4), a first pair of arms 35 extends, at a distance and in a symmetrical way, along a first diagonal of the rectangular shape defined by the decoupling cavity 30, whereas a second pair of arms 35 extends, at a distance and in a symmetrical way, along a second diagonal of the rectangular shape defined by the decoupling cavity 30. In addition, the arms 35 have a thickness equal to the distance between the top inner surface $S_3$ and the bottom inner surface $S_4$. In other words, each arm 35 is interposed, in direct contact, between the top inner surface $S_3$ and the bottom inner surface $S_4$.

Figure 4:
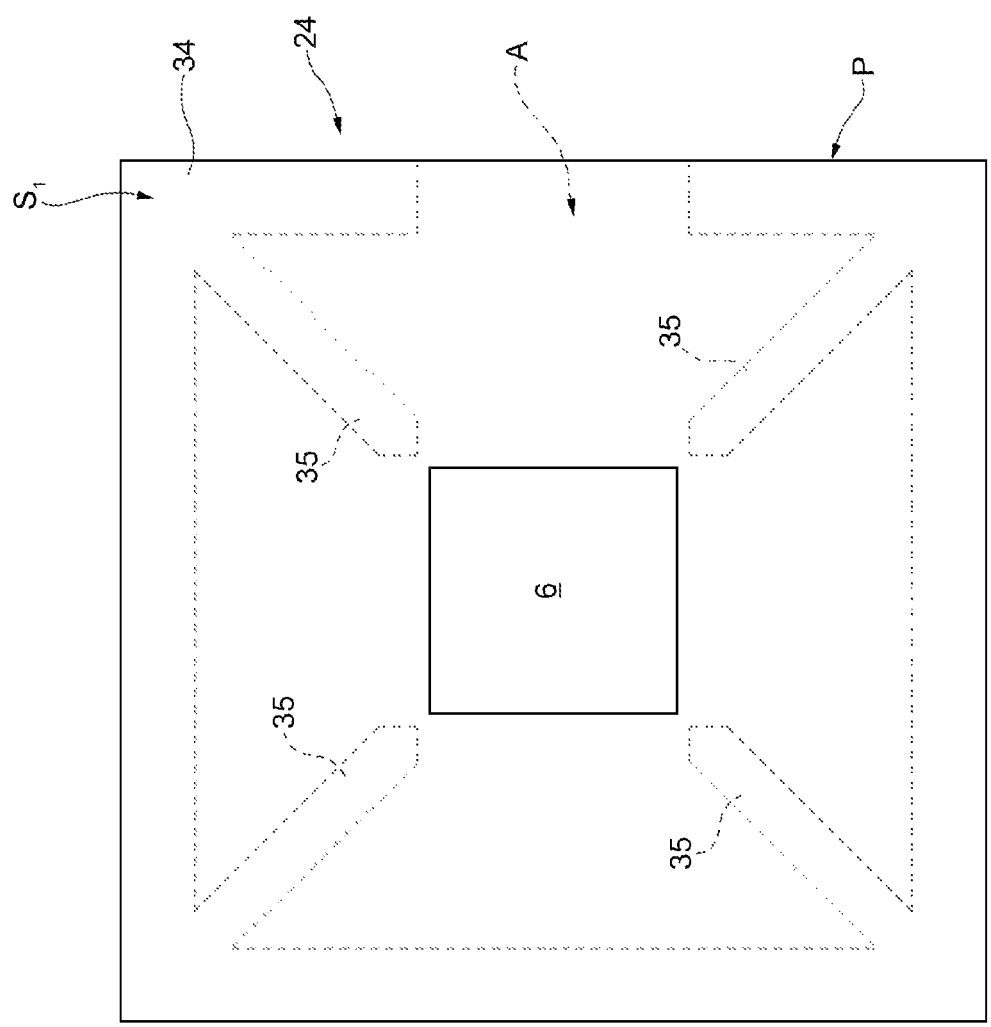
FIG. 4 is a schematic top view with portions removed of the sensor illustrated in FIGS. 1 to 3.

As may be seen once again in FIG. 4, the die 6 is laterally staggered with respect to the arms 35; i.e., it rests on a portion of the main body 34 that is laterally staggered with respect to arms 35. The arms 35 provide mechanical support and robustness to the system during assembly (for example, in the die-attach and wire-bonding steps) and may constitute the site of electrical links. Furthermore, the arms 35 bestow stiffness so that the decoupling cavity 30 maintains its shape over time, and therefore its capacity for thermally decoupling the die 6 and the PCB 2.

The decoupling cavity 30 has a lateral opening A, which faces onto a side wall P of the main body 34 of the first insulating structure 24. The lateral opening A sets the decoupling cavity 30 in fluidic communication with the outside world.

The package 20 further comprises a plurality of first pads 40 of conductive material, which extend below the bottom surface $S_2$ and are to be electrically connected to corresponding electrical terminals (not illustrated) present on the PCB 2. Moreover, the package 20 comprises a plurality of wire bondings 42, which enable connection of corresponding conductive pads (not illustrated) present on the die 6 to corresponding first pads 40 via interposition of corresponding electrical links 44 (only two of which are represented schematically in FIG. 1), which extend through the main body 34 of the first insulating structure 24. In practice, the wire bondings 42 each connect a corresponding conductive pad (not illustrated) of the die 6 to a corresponding electrical link 44. Through the wire bondings 42, the electrical links 44 and the first pads 40, the processing circuit 10 can supply, among other things, the output signal to the outside world, in particular to further electronic components (not illustrated) that equip the PCB 2.

In use, the bottom surface $S_2$ of the main body 34 of the first insulating structure 24 faces the PCB 2. The first insulating structure 24 is thus interposed between the PCB 2 and the die 6. In addition, thanks to the fact that the first insulating structure 24 is formed of thermally insulating material, and thanks to the further function of insulation implemented by the decoupling cavity 30, a good thermal decoupling is obtained between the sensing device 4 and possible heat sources present on the PCB 2. In particular, said decoupling is further improved by the presence of the lateral opening A in the first insulating structure 24, which enables circulation of the air or of other gas/liquid coolant within the decoupling cavity 30.

In this way, to a first approximation, the electrical signal is generated by the sensitive region 8 as a function of only the temperature of the air (or, possibly, the liquid) surrounding the first cap 22, i.e., in a way substantially independent of the heat generated by components present on the PCB 2. Consequently, the output signal supplied by the processing circuit 10 is effectively indicative of the temperature of the medium in which the temperature sensor 1 is set, without being affected by heat sources present on the PCB 2.

Figure 5:
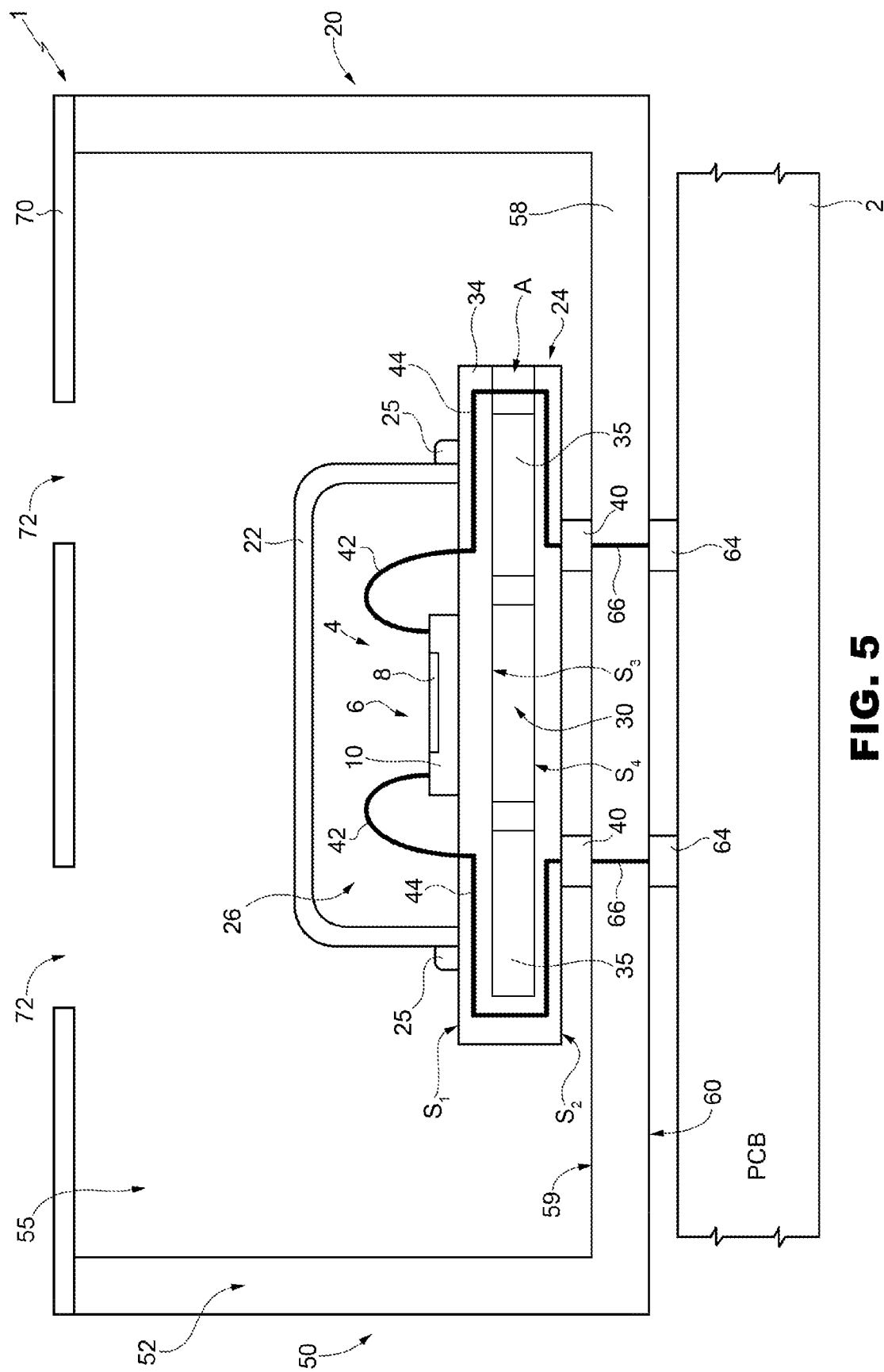
FIG. 5 is a schematic cross-sectional view of a temperature sensor, coupled to a PCB.

FIG. 5 shows a different embodiment, which is now described with reference to the differences with respect to the embodiment illustrated in FIGS. 1-4.

The package 20 comprises a second insulating structure 50, which includes a container 52, formed of insulating material, such as, for example, a material chosen from among ceramic, alumina or a BT resin. In addition, the container 52 has the shape of a hollow parallelepiped, open at the top. In other words, the container 52 delimits at the bottom and laterally a cavity 55, referred to in what follows as the coupling cavity 55.

In greater detail, the container 52 comprises a bottom wall 58, which is delimited at the bottom and at the top, respectively, by a first and a second wall surface 59, 60.

Furthermore, the first insulating structure 24 and the cap 22, and therefore also the die 6, are arranged in the coupling cavity 55 so that the bottom surface $S_2$ of the main body 34 of the first insulating structure 24 faces the first wall surface 59. In particular, the first pads 40 overlie the first wall surface 59, in direct contact therewith. In addition, the second insulating structure 50 comprises a plurality of second conductive pads 64, which are fixed to the container 52 and extend below the second wall surface 60.

The second conductive pads 64 are electrically connected to corresponding electrical terminals (not illustrated) present on the PCB 2, as well as to corresponding first pads 40. In particular, each second pad 64 is electrically connected to a corresponding first pad 40, by means of a corresponding electrical link 66, which extends through the bottom wall 58 of the container 52. The output signal generated by the processing circuit 10 is therefore supplied to the PCB 2 through the second pads 64.

The second insulating structure 50 further comprises a second cap 70, which may have a planar shape, is formed, for example, of thermally conductive material (e.g., steel) and is mechanically coupled to the container 52, for example by means of a glue or solder paste (not illustrated) so as to close the coupling cavity 55.

In greater detail, the second cap 70 overlies the first cap 22 at a distance. Moreover, the second cap 70 is traversed by a number of holes 72 (two of which are illustrated in FIG. 5), which have, for example, a cylindrical shape and set the coupling cavity 55 in fluidic communication with the outside world.

In practice, the presence of the second insulating structure 50 enables further improvement of the thermal decoupling between the sensitive region 8 of the sensing device 4 and the PCB 2. In fact, in addition to the first insulating structure 24, a portion (in particular, the bottom wall 58) of the container 52, which is made of insulating material is interposed between the PCB 2 and the die 6. In addition, the holes 72 enable exchange of gas/liquid between the outside world and the coupling cavity 55, thus improving thermal coupling between the outside world and the sensing device 4.

The advantages that the present temperature sensor affords emerge clearly from the foregoing description. In particular, the present temperature sensor includes a package that enables integration thereof on board a PCB, at the same time guaranteeing a good thermal insulation of the temperature-sensing device from the heat sources present on the PCB so as to enable correct measurement of the temperature of the medium (fluid) in which the temperature sensor is located.

Finally, it is clear that modifications and variations may be made to what has been described and illustrated herein, without departing from the scope of the present disclosure.

For instance, the electrical coupling between the die 6 and the first pads 40 and (if present) the second pads 64 may be different from what has been described. For instance, instead of wire bondings 42, the die 6 may be coupled to the electrical links 44 that traverse the main body 34 of the first insulating structure 24 by means of bumps (not shown) arranged underneath the die 6.

Likewise, instead of the conductive pads, different types of electrical terminals may be used.

The decoupling cavity 30 may have more than one side opening.

Finally, the number and shape of the arms 35 may differ from what has been described; the arms 35 may possibly even be absent.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An ambient temperature sensor couplable to a printed circuit board (PCB), the ambient temperature sensor comprising:

a package including a first cap and an insulating structure, the insulating structure having a main body and being formed of thermally insulating material, the first cap and the insulating structure delimiting a first cavity; and a semiconductor device configured to generate an electrical signal indicative of a temperature, the semiconductor device being fixed on the insulating structure and arranged within the first cavity, wherein the package is configured to couple to the PCB with the insulating structure interposed between the semiconductor device and the PCB, and wherein the insulating structure delimits a second cavity arranged within the main body of the insulating structure, which extends below the semiconductor device and is open laterally.

2. The temperature sensor according to claim 1, wherein the second cavity is closed along a direction of the semiconductor device and of the PCB.

3. The temperature sensor according to claim 1, wherein the insulating structure is delimited by a front surface and by a rear surface, the front surface being interposed between the semiconductor device and the rear surface, and wherein the second cavity extends, at a distance, between the front surface and the rear surface.

4. The temperature sensor according to claim 3, further comprising a plurality of first electrical terminals electrically connected to the semiconductor device and extending on the rear surface.

5. The temperature sensor according to claim 4, further comprising a plurality of electrical links extending at least in part in the insulating structure and configured to electrically connect the semiconductor device to the first electrical terminals.

6. The temperature sensor according to claim 1, wherein the package further includes a container of thermally insulating material, the container delimiting a third cavity inside which the first cap, the insulating structure and the semiconductor device are arranged, and wherein the package is configured to couple to the PCB with a portion of the container interposed between the insulating structure and the PCB.

7. The temperature sensor according to claim 6, further comprising a plurality of second electrical terminals electrically connected to the semiconductor device and fixed to the container, wherein the second electrical terminals are configured to couple to the PCB.

8. The temperature sensor according to claim 6, wherein the package further comprises a second cap, the second cap closes the third cavity and is traversed by at least one hole configured to set the third cavity in fluidic communication with an outside environment.

9. The temperature sensor according to claim 1, wherein the first cap is without holes and is formed of thermally conductive material.

10. The temperature sensor according to claim 1, wherein the second cavity is delimited at the bottom and at the top by a top inner surface and by a bottom inner surface, respectively, and wherein the insulating structure comprises at least one arm having an elongated shape and extending from a peripheral portion of the second cavity towards a central portion of the second cavity, the arm being interposed, in direct contact, between the top inner surface and the bottom inner surface.

11. The temperature sensor according to claim 1, wherein the semiconductor device comprises a die in which an application-specific integrated circuit is formed.

12. A system, comprising:
a printed circuit board (PCB); and
a temperature sensor coupled to the PCB, the temperature sensor including:
a package including a first cap and an insulating structure, the insulating structure being formed of thermally insulating material, the first cap and the insulating structure delimiting a first cavity;
a semiconductor device configured to generate an electrical signal indicative of a temperature, the semiconductor device being fixed on the insulating structure and arranged within the first cavity,
wherein the package is coupled to the PCB with the insulating structure interposed between the semiconductor device and the PCB, and wherein the insulating structure delimits a second cavity, which extends below the semiconductor device and is open laterally; and
a third cavity delimited by a container of thermally insulating material.

13. The system according to claim 12, wherein the insulating structure is delimited by a front surface and by a rear surface, the front surface being interposed between the semiconductor device and the rear surface, and wherein the second cavity extends, at a distance, between the front surface and the rear surface.

14. The system according to claim 13, further comprising:
a plurality of first electrical terminals electrically connected to the semiconductor device and extending on the rear surface; and
a plurality of electrical links extending at least in part in the insulating structure and configured to electrically connect the semiconductor device to the first electrical terminals.

15. The system according to claim 12, wherein the container of thermally insulating material delimits the third cavity inside which the first cap, the insulating structure and the semiconductor device are arranged, and wherein the package coupled to the PCB with a portion of the container interposed between the insulating structure and the PCB.

16. The system according to claim 15, further comprising a plurality of second electrical terminals electrically connected to the semiconductor device and fixed to the container, wherein the second electrical terminals are configured to couple to the PCB.

17. The system according to claim 15, wherein the package further comprises a second cap, the second cap closes the third cavity and is traversed by at least one hole configured to set the third cavity in fluidic communication with an outside environment.

18. The system according to claim 12, wherein the second cavity is delimited at the bottom and at the top by a top inner surface and by a bottom inner surface, respectively, and wherein the insulating structure comprises at least one arm having an elongated shape and extending from a peripheral portion of the second cavity towards a central portion of the second cavity, the arm being interposed, in direct contact, between the top inner surface and the bottom inner surface.

19. A method, comprising:
coupling a temperature sensor to a printed circuit board (PCB), the temperature sensor including:
a package including a first cap and an insulating structure, the insulating structure having a main body and being formed of thermally insulating material, the first cap and the insulating structure delimiting a first cavity; and
a semiconductor device configured to generate an electrical signal indicative of a temperature, the semiconductor device being fixed on the insulating structure and arranged within the first cavity,
wherein the package is coupled to the PCB with the insulating structure interposed between the semiconductor device and the PCB, and wherein the insulating structure delimits a second cavity arranged within the main body of the insulating structure, which extends below the semiconductor device and is open laterally.

20. The method of claim 19, further comprising:
electrically connecting a plurality of electrical links between the semiconductor device and a plurality of first electrical terminals extending on a rear surface of the insulating structure, the plurality of electrical links extending at least in part in the insulating structure.

* * * * *